(12) United States Patent
Urushihara et al.

(10) Patent No.: US 8,507,051 B2
(45) Date of Patent: Aug. 13, 2013

(54) POLYCRYSTALLINE SILICON PRODUCING METHOD

(75) Inventors: Makoto Urushihara, Nakagun (JP); Kazuki Mizushima, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 405 days.

(21) Appl. No.: 12/805,083

(22) Filed: Jul. 12, 2010

(65) Prior Publication Data

US 2011/0014468 A1    Jan. 20, 2011

(30) Foreign Application Priority Data

Jul. 15, 2009 (JP) ................................. 2009-167185

(51) Int. Cl.
*C23C 16/24* (2006.01)

(52) U.S. Cl.
USPC ..................... 427/543; 427/591; 427/255.393

(58) Field of Classification Search
USPC .................................... 427/543, 255.393, 591
See application file for complete search history.

(56) References Cited

U.S. PATENT DOCUMENTS

| | | | |
|---|---|---|---|
| 4,147,814 A * | 4/1979 | Yatsurugi et al. | 427/588 |
| 4,179,530 A | 12/1979 | Köppl et al. | |
| 5,976,481 A * | 11/1999 | Kubota et al. | 423/348 |
| 6,007,869 A * | 12/1999 | Schreieder et al. | 427/213 |
| 6,284,312 B1 * | 9/2001 | Chandra et al. | 427/237 |
| 6,635,225 B1 * | 10/2003 | Thiem et al. | 422/65 |
| 7,632,478 B2 | 12/2009 | Poepken et al. | |
| 7,732,012 B2 * | 6/2010 | Hongu et al. | 427/255.27 |
| 7,816,269 B2 * | 10/2010 | Aslami et al. | 438/689 |
| 2002/0014197 A1 * | 2/2002 | Keck et al. | 117/87 |
| 2004/0091630 A1 * | 5/2004 | Sonnenschein | 427/428.1 |
| 2007/0034146 A1 * | 2/2007 | Nakashima et al. | 117/200 |
| 2007/0248521 A1 * | 10/2007 | Kutsovsky et al. | 423/324 |
| 2009/0136666 A1 * | 5/2009 | Endoh et al. | 427/255.18 |
| 2009/0209093 A1 * | 8/2009 | Aslami et al. | 438/488 |
| 2009/0229991 A1 * | 9/2009 | Wallmeier | 205/341 |
| 2011/0052914 A1 * | 3/2011 | Urushihara et al. | 428/392 |
| 2011/0274851 A1 * | 11/2011 | Miyazawa et al. | 427/546 |
| 2012/0058022 A1 * | 3/2012 | Revankar et al. | 422/187 |
| 2012/0100302 A1 * | 4/2012 | Fabry et al. | 427/534 |

FOREIGN PATENT DOCUMENTS

| | | |
|---|---|---|
| JP | 2001-146499 A | 5/2001 |
| JP | 2003-128492 A | 5/2003 |
| JP | 2007-526203 T | 9/2007 |

* cited by examiner

*Primary Examiner* — Bret Chen
(74) *Attorney, Agent, or Firm* — Edwards Wildman Palmer LLP

(57) ABSTRACT

A polycrystalline silicon producing method includes: the first process and the second process. In the first process, a surface temperature is maintained at a predetermined range by adjusting the current value to the silicon seed rod, and the raw material gas is supplied while maintaining a supply amount of chlorosilanes per square millimeter of the surface of the rod in a predetermined range until a temperature of the center portion of the rod reaches a predetermined temperature lower than the melting point of the polycrystalline silicon, and in the second process, a previously determined current value is set corresponding to a rod diameter and the supply amount of the raw material gas per square millimeter of the surface of the rod is decreased to maintain the surface temperature and the temperature of the center portion of the rod at predetermined ranges, respectively.

9 Claims, 14 Drawing Sheets

POLYCRYSTALLINE SILICON PRODUCING METHOD

BACKGROUND OF THE INVENTION

1. Field of the Invention

The present invention relates to a polycrystalline silicon producing method, an apparatus for producing the polycrystalline silicon, and the polycrystalline silicon produced by the polycrystalline silicon producing method.

Priority is claimed on Japanese Patent Application No. 2009-167185, filed Jul. 15, 2009, the content of which is incorporated herein by reference.

2. Description of Related Art

As a polycrystalline silicon producing method, a method of producing by the Siemens method has been known. According to this polycrystalline silicon producing method, a plurality of silicon seed rods stand upright in a reactor and are supplied electric current and heated, and raw material gas including chlorosilane gas and hydrogen gas is supplied to the reactor to bring the raw material gas into contact with the heated silicon seed rods. On the surface of the heated silicon seed rods, polycrystalline silicon is deposited by heat decomposition or hydrogen reduction of the raw material gas and grows in a rod shape. In this case, every two silicon seed rods are paired and the upper end portions thereof are connected to each other by a connecting rod made of the same silicon as the silicon seed rod so that they are formed in an inverted (upside-down) U-shape or a Π-shape.

In the polycrystalline silicon producing method, there is a method of increasing an amount of raw material supply as one of methods of increasing a growth rate of polycrystalline silicon.

According to Japanese Unexamined Patent Application, First Publication No. 2003-128492, it is described that, when a supply amount of raw material gas is small, the deposition of polycrystalline silicon is insufficient, and by sufficiently supplying the raw material gas, a polycrystalline silicon growth rate increases. In addition, in Japanese Unexamined Patent Application, First Publication No. 2003-128492, it is described that an amount of raw material gas supply per square centimeter of a surface of a rod is controlled in the range of $3.5 \times 10^{-4}$ to $9.0 \times 10^{-4}$ mol/cm²min.

On the other hand, it is not preferable that raw material gas is excessively supplied because a ratio of the raw material gas contributing to the deposition reaction of polycrystalline silicon decreases, and thus a deposition amount of polycrystalline silicon per an amount of raw material supply (yield of the polycrystalline silicon) decreases.

Accordingly, it can be considered that by increasing an amount of raw material supply under the condition where the pressure in a reactor is increased, a growth rate is increased while the decrease of yield is suppressed. U.S. Pat. No. 4,179,530 describes that polycrystalline silicon is produced at a pressure of 1 to 16 bars, and preferably 4 to 8 bars. In addition, Published Japanese Translation No. 2007-526203 of the PCT International Publication describes that, although the Siemens method is not employed, deposition of polycrystalline silicon are achieved at a pressure of 1 millibar to 100 bar (absolute pressure).

SUMMARY OF THE INVENTION

Problems to be Solved by the Invention

As described above, when the inside of the reactor is made to be in a high pressure state and a large amount of the raw material gas is then supplied, the growing rate of polycrystalline silicon can be increased while maintaining the yield. Accordingly, it is thought that a polycrystalline silicon can be efficiently produced.

In a polycrystalline silicon rod such as a recharge rod for CZ (Czochralski method) or a rod for FZ (Floating Zone method) for use in producing of singlecrystalline silicon for semiconductors, a large rod diameter can efficiently produce singlecrystalline silicon. Accordingly, for example, a polycrystalline silicon rod having a diameter of 100 mm or more is required. Moreover, it is desirable that the polycrystalline silicon has a smooth surface.

However, according to the examination of the inventors of the present invention, when the inside of the reactor is made to be in a high pressure state and a large amount of the raw material gas is then supplied, a rate of gas flow brought into contact with the surface of a rod increases, so the convection heat transfer from the silicon rod to the gas increases. At this time, in order to maintain the surface temperature of the rod at a temperature suitable for the growth of the silicon rod, it is required to increase the current value in the silicon seed rod. By increasing the current value, the temperature of the center portion of the rod which is compared to the case of a normal pressure or a normal flow rate is increased. For this reason, when the rod grows to some extent, the temperature of the connecting portion between the silicon seed rod and the rod connected thereto increases and thus meltdown (fusing) is caused and a problem occurs in that the rod cannot be grown to have a large diameter of, for example, 100 mm or larger. The producing of polycrystalline silicon by the Siemens method employs a batch system. When the rod after the growth is thin, the productivity decreases.

In order to prevent the meltdown, it can be considered that the surface temperature of the rod is lowered by adjusting the electric current supplying the silicon seed rod. However, when the surface temperature of the rod is lowered, the growth rate of the rod and the yield decrease and thus polycrystalline silicon cannot be efficiently grown. In addition, since the difference between the center temperature and the surface temperature of the rod is large, cracking easily occurs in the rod due to heat stress in a stage of cooling the rod to room temperature after the growth.

The present invention is contrived in view of the circumstances and an object of the present invention is, in the producing of polycrystalline silicon, to maintain high yield and a high growth rate under the condition where a larger amount of raw material gas than in conventional cases is supplied at a high pressure in the production of polycrystalline silicon, to prevent the meltdown of a rod, and to make a rod having a smooth surface grow to thereby have a large diameter.

Means for Solving the Problem

As described above, when the inside of the reactor is made to be in a high pressure state and a large amount of the raw material gas is then supplied, a gas flow rate is increased and the convection heat transfer from the rod to the gas thus increases. Accordingly, the temperature of the center portion of a rod is markedly increased and thus meltdown is likely to easily occur in the rod and there is a problem in that the rod cannot be grown to have a large diameter of, for example, 100 mm or larger. When the surface temperature of the rod is decreased by adjusting the electric current supplying the silicon seed rod, the rod can be grown to have a large diameter while the meltdown is prevented. However, in this method, the growing rate and yield deteriorate. Accordingly, the inventors of the present invention have invented a method in which by controlling both the current value in the silicon seed rod and the amount of raw material gas supply, the surface temperature and the temperature of the center portion of the rod are maintained at a predetermined temperature range and thus a rod having a smooth surface and a rod diameter of 100 mm or larger is grown while meltdown is prevented and a high growing rate and yield are maintained.

That is, a polycrystalline silicon producing method of the present invention includes: supplying electric current to a silicon seed rod in a reactor to make the silicon seed rod to generate heat; supplying raw material gas including chlorosilanes to the silicon seed rod; and depositing polycrystalline silicon on a surface of the silicon seed rod to be grown as a rod. The pressure in the reactor is equal to or greater than 0.4 MPa and equal to or less than 0.9 MPa. In the first process, a surface temperature of the rod is maintained at a predetermined range by gradually increasing the current value in the silicon seed rod, and the raw material gas is supplied while maintaining a supply amount of chlorosilanes per square millimeter of a surface of the rod to be equal to or greater than $2.0 \times 10^{-7}$ mol/sec/mm$^2$ and equal to or less than $3.5 \times 10^{-7}$ mol/sec/mm$^2$ until a temperature of the center portion of the rod reaches a predetermined temperature lower than the melting point of the polycrystalline silicon, and after the temperature of the center portion of the rod reaches a predetermined temperature lower than the melting point of the polycrystalline silicon, in the second process, a previously determined current value is set corresponding to a rod diameter and the supply amount of the raw material gas per square millimeter of the surface of the rod is decreased to maintain the surface temperature and the temperature of the center portion of the rod to be within predetermined ranges, respectively.

In this producing method, the pressure in the reactor is equal to or greater than 0.4 MPa and equal to or less than 0.9 MPa. In the first process, by increasing the current value corresponding to an increase in a rod diameter, the surface temperature of the rod is maintained at a predetermined range, and the supply amount of chlorosilanes per square millimeter of the surface of the rod is maintained in the range equal to or greater than $2.0 \times 10^{-7}$ mol/sec/mm$^2$ and equal to or less than $3.5 \times 10^{-7}$ mol/sec/mm$^2$, which is a larger supply amount than in conventional cases. In the second process after the temperature of the center portion of the rod reached a predetermined temperature lower than the melting point, by controlling the current value and the supply amount of the raw material gas, the surface temperature of the rod is maintained at a predetermined range. Accordingly, in the first process, rods are grown in a short time by a high-pressure condition and the supply of a large amount of raw material gas. In the second process, by maintaining the surface temperature of the rod within a predetermined range, an increase in the temperature of the center portion of the rod is suppressed while maintaining a high yield, so meltdown is prevented and the rod diameter can be increased.

Regarding the temperature of the center portion of the rod in the present specification, the expression "predetermined temperature" is lower than the melting point of polycrystalline silicon and is a temperature at which meltdown does not occur in the connecting portion between the silicon seed rod and the connecting member. Regarding the surface temperature of the rod of the present invention, the expression "predetermined ranges" is a temperature ranges at which the temperature of the center portion of the rod can be maintained at the predetermined temperature while having an effect of promoting the deposition of polycrystalline silicon.

When the pressure exceeds 0.9 MPa, a problem occurs in the pressure-resistance design, such as an extreme increase in a flange thickness or the like. On the other hand, when the pressure is less than 0.4 MPa, yield is decreased over the whole process. In addition, when pressure loss is considered, the pipe diameter is increased to flow a large amount of the gas and thus the structure under the reactor or the bottom plate of the reactor becomes complicated.

When the supply amount of chlorosilanes exceeds $3.5 \times 10^{-7}$ mol/sec/mm$^2$, the yield of polycrystalline silicon that is obtained in the first process is decreased as a batch (in other words, the yield is decreased through the entire process). On the other hand, when the gas flow rate is less than $2.0 \times 10^{-7}$ mol/sec/mm$^2$, polycrystalline silicon cannot be rapidly grown. In addition, since irregularities are formed on the surface of the polycrystalline silicon rod, it is not possible to produce polycrystalline silicon suitable for producing single-crystalline silicon for semiconductors having a smooth surface.

In the Siemens method, a silicon seed rod having a square cross-section is used. However, whether this cross-section of the silicon seed rod is grown round or not in the first process has a large effect on the surface state of a finally produced polycrystalline silicon rod. In order to make a rod round, it is necessary to sufficiently supply raw material gas (chlorosilanes) in the first process. According to the polycrystalline silicon producing method of the present invention, a large amount of raw material gas is supplied in the first process and thus a rod having a square cross-section is grown into a polycrystalline silicon rod having a sufficiently round cross-section. In the present invention, although the gas flow rate is adjusted in the second process, a round bar state is achieved in the first process. Accordingly, the finally produced polycrystalline silicon has a smooth surface and is suitable as polycrystalline silicon for semiconductors.

In the producing method of the present invention, it is desirable that the temperature of the center portion of the rod in the second process be in the range equal to or higher than 1200° C. and equal to or lower than 1300° C. The temperature of the center portion of the rod is set as high as possible while being lower than the melting point of polycrystalline silicon.

In the producing method of the present invention, the temperature of the inner surface of the reactor may be adjusted to be equal to or higher than 250° C. and equal to or lower than 400° C. When the temperature of the inner surface of the reactor is increased in advance, the heat quantity that is transmitted to the inner wall of the reactor by the radiation from the rod surface can be reduced. That is, by suppressing an increase in the temperature of the center portion of the rod and prolonging the first process, the growing rate can be increased as a batch (in other words, the growing rate can be increased through the entire process).

In the producing method of the present invention, it is desirable that the raw material gas is supplied to the reactor after being pre-heated to be equal to or higher than 200° C. and equal to or lower than 600° C. When the raw material gas is pre-heated, the heat quantity escaping due to the convection heat transfer from the rod surface to the raw material gas can be reduced. That is, by suppressing an increase in the temperature of the center portion of the rod and prolonging the first process, the growing rate can be increased as a batch (in other words, the growing rate can be increased through the entire process).

In this case, when a pre-heating temperature of the raw material gas is adjusted to be equal to or higher than 200° C. and equal to or lower than 400° C., it is suitable in the producing of polycrystalline silicon for semiconductors.

When the pre-heating temperature of the raw material gas exceeds 400° C., impurities are incorporated into the raw material gas from the metal material of a pre-heater or the like and thus the concentration of impurities in produced polycrystalline silicon is increased. Accordingly, it is desirable the heating temperature is equal to or higher than 200° C. and equal to or lower than 400° C. in order to produce a polycrystalline silicon suitable for use in semiconductors. Even when the raw material gas is heated to equal to or higher than 400° C. and equal to or lower than 600° C. to produce the polycrystalline silicon, the polycrystalline silicon can be used in solar cells.

When the raw material gas is pre-heated as described above, it is efficient that the raw material gas is pre-heated by heat-exchanging the raw material gas and the discharge gas discharged from the reactor.

In the producing method of the present invention, in the reactor, it is desirable that no ejection nozzles for supplying raw material gas are disposed between the inner surface of the reactor and the rods positioned at the outermost circumference.

Since the rods positioned at the outermost circumference are directly opposed to the inner wall of the reactor, meltdown is easily caused by a large heat quantity that is transmitted to the inner wall of the reactor by the radiation from the surface of the rods. When a structure in which no ejection nozzles for supplying raw material gas are disposed on that side is employed, the convection heat transfer from the rods positioned at the outermost circumference to the gas can be suppressed so as to decrease the possibility of a meltdown.

The polycrystalline silicon which is produced by the above-described method can be made to have a diameter of 100 mm or larger while a high growth rate and yield are maintained.

An apparatus for producing polycrystalline silicon, includes, a reactor having a bell jar and a bottom plate closing an opening of the bell jar, a plurality of electrodes which are installed on an upper surface of the bottom plate and supply electric current to silicon seed rods attached on the electrodes, a plurality of ejection nozzles which are provided on the upper surface of the bottom plate and supply a raw material gas including chlorosilanes into the reactor, a plurality of gas discharge ports which are provided on the upper surface of the bottom plate and discharge the gas after the reaction to an outside of the reactor; a thermometer which measures temperature of a surface of a rod obtained by depositing polycrystalline silicon on the seed rods; a diameter measuring device which measures diameter of the rod; and a controller which controls a flow of the raw material gas supplied from the ejection nozzles and the electric current flowing through each of the silicon seed rod based on the temperature measured by the thermometer and the diameter of the rod measured by the diameter measuring device, wherein the controller is programmed to perform the step of, i) controlling a pressure in the reactor is equal to or greater than 0.4 MPa and equal to or less than 0.9 MPa;

ii) maintaining the temperature of a surface of a rod at a predetermined range and maintaining a supply amount of chlorosilanes per square millimeter of the surface of the rod (R) to be equal to or greater than $2.0 \times 10^{-7}$ mol/sec/mm$^2$ and equal to or less than $3.5 \times 10^{-7}$ mol/sec/mm$^2$ until a temperature of the center portion of the rod reaches a predetermined temperature lower than the melting point of the polycrystalline silicon; and iii) setting current value to a previously determined current value corresponding to the diameter of the rod, decreasing the supply amount of the raw material gas per square millimeter of the surface of the rod, and maintaining the surface temperature and the temperature of the center portion of the rod to be within predetermined ranges, after the temperature of the center portion of the rod reaches a predetermined temperature lower than the melting point of the polycrystalline silicon.

In the apparatus for producing the polycrystalline silicon, the bottom plate and the bell jar are respectively formed in a double-walled structure having interior space, and a coolant supply tube and a coolant discharge tube are connected to the bottom plate or the bell jar for circulating a coolant in the interior spaces of the double-walled structures.

In the apparatus for producing the polycrystalline silicon, the electrodes is disposed along concentric circles on the upper surface of the bottom plate, and the ejection nozzles are not provided between an inner wall of the bell jar and the electrodes positioned along an outermost concentric circles.

Effects of the Invention

According to a polycrystalline silicon producing method of the present invention, in the first process, a larger amount of raw material gas is supplied at higher pressure than in conventional cases, and thus the rod can be grown in a short time. In the second process, the current and the amount of raw material gas supply are controlled while the temperature of the center portion of the rod is monitored, so that the surface temperature and the temperature of the center portion of the rod are maintained at predetermined ranges, respectively. Accordingly, meltdown of the rod is prevented, and a large-diameter polycrystalline silicon rod can be produced in the shortest time in a state in which the amount of polycrystalline silicon deposition per the amount of chlorosilanes supply is maintained at the high level.

In addition, since a large amount of raw material gas is supplied in the first process, a silicon seed rod having a square cross-section can be grown into a round bar-shaped rod having a smooth surface and it is possible to produce polycrystalline silicon suitable for semiconductors.

BRIEF DESCRIPTION OF THE DRAWINGS

FIG. 2A shows changes in a current value I supplying to a silicon seed rod and a supply amount F of chlorosilanes per square millimeter of the surface of the rod with respect to a rod diameter RD. FIG. 2B shows changes in a center temperature Tc and a surface temperature Ts of the rod with respect to a rod diameter RD.

FIG. 9A shows changes in a supply amount F of chlorosilanes per square millimeter of the surface of the rod with respect to a rod diameter RD. FIG. 9B shows changes in a current value I with respect to a rod diameter RD. FIG. 9C shows changes in a surface temperature Ts and a center temperature Tc of the rod with respect to a rod diameter RD (hereinafter, the relationship between the X axis and the Y axis in FIGS. 10A to 10C, FIGS. 11A to 11C, FIGS. 12A to 12C, FIGS. 13A to 13C, FIGS. 14A to 14C and FIGS. 15A to 15C, is the same as in FIGS. 9A to 9C).

DETAILED DESCRIPTION OF THE INVENTION

Hereinafter, an embodiment of the polycrystalline silicon producing method according to the present invention will be described with reference to the drawings.

Figure 1:
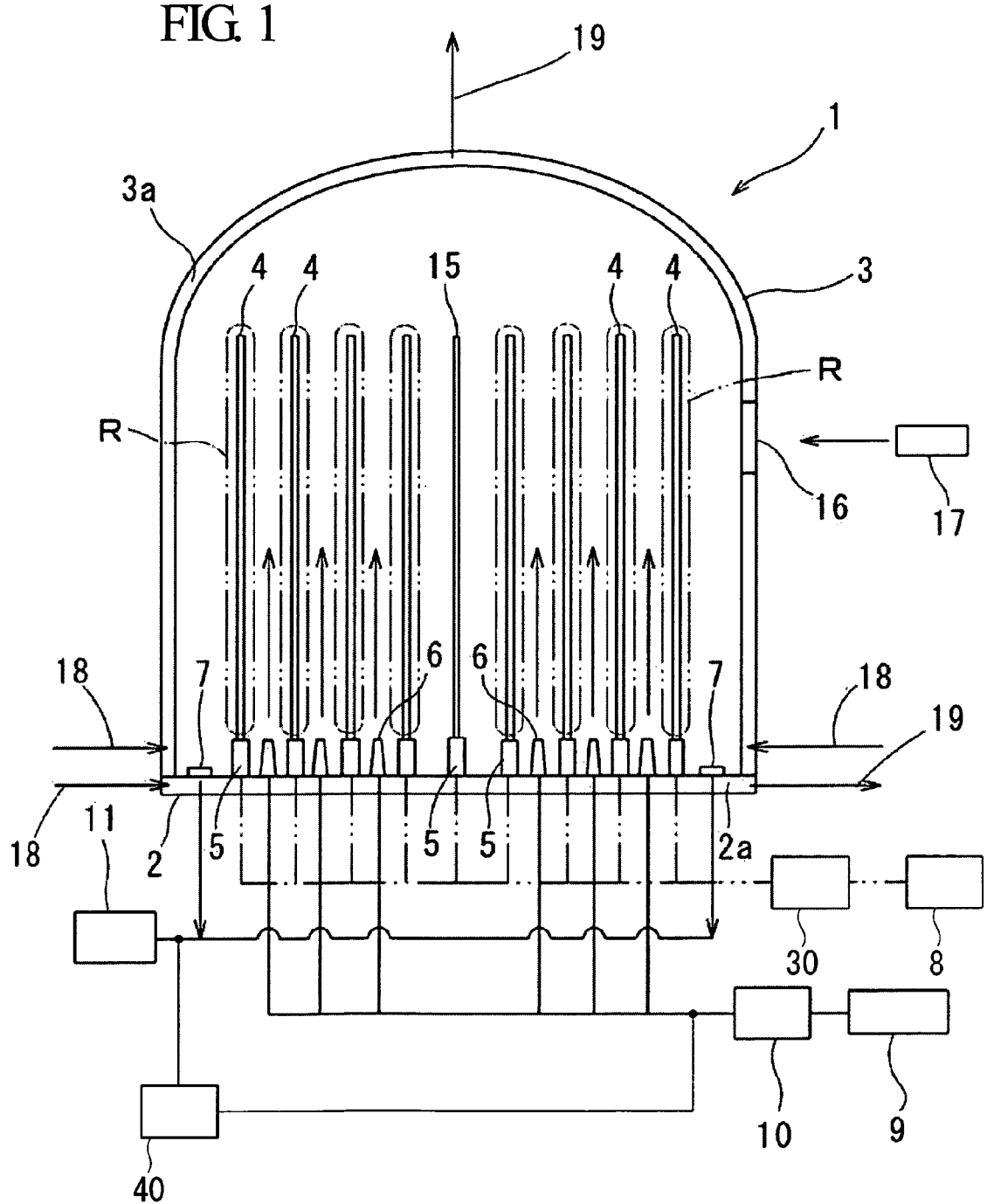
FIG. 1 is a configuration diagram showing the cross-section of a reactor of a producing apparatus used in a polycrystalline silicon producing method according to an embodiment of the present invention.

FIG. 1 is an overall view of a polycrystalline silicon producing apparatus used in the producing method according to the present invention. The polycrystalline silicon producing apparatus has a reactor 1. The reactor 1 is provided with a bottom plate 2 constituting the bottom of the reactor and a bell-shaped bell jar 3 fixed on the bottom plate 2.

As shown in FIG. 1, on the bottom plate 2, a plurality of electrodes 5 to which silicon seed rods 4 are installed, a plurality of ejection nozzles 6 for ejecting raw material gas including chlorosilanes and hydrogen gas to the inside of the reactor and a plurality of gas discharge ports 7 for discharging the gas after the reaction to the next process are provided.

The electrodes 5 are made of carbon formed in a substantially cylindrical shape. They are disposed in a substantially concentric pattern (concentric circles) with certain intervals therebetween on the bottom plate 2 and stand vertically upright on the bottom plate 2. Each of the electrodes 5 is connected to an external power supply 8 of the reactor 1 via a current control device 30 to adjust the amount of the electric current supplying the silicon seed rod 4. In addition, at the upper end portion of the electrode 5, a hole (not shown) is formed along the axis thereof and the lower end portion of the silicon seed rod 4 is inserted into the hole to install the silicon seed rod 4.

The silicon seed rod 4 is fixed so that the lower end thereof is put in the electrode 5, and stands upright so as to extend upward. By a connecting member (not shown) made of the same silicon as the silicon seed rod 4, every two silicon seed rods 4 are connected to each other at upper end portions thereof and they are assembled in an inverted (upside-down) U-shape or a Π-shape.

The plurality of ejection nozzles 6 of the raw material gas are installed with suitable intervals therebetween and dispersed on almost all parts of the upper surface of the bottom plate 2 of the reactor 1 so that the raw material gas is uniformly supplied to the silicon seed rods 4. These ejection nozzles 6 are connected to an exterior raw material gas supply source 9 of the reactor 1 and the raw material gas supply source 9 is provided with a raw material gas adjuster 10. By the raw material gas adjuster 10, an amount of raw material gas supply from the ejection nozzle 6 and a pressure of raw material gas can be adjusted. The plurality of gas discharge ports 7 are installed with suitable intervals therebetween on a portion adjacent to the outer circumference of the bottom plate 2 and are connected to a discharge gas processing system 11.

The raw material gas adjuster 10 and the current control device 30 are a controller.

At the center portion of the reactor 1, a heater 15 made of carbon is provided as a heating apparatus so as to be assembled in an inverted (upside-down) U-shape or a Π-shape in an electrode 5 on the bottom plate 2 and to stand upright. The heater 15 is almost as tall as the silicon seed rods 4. The heater 15 heats the silicon seed rods 4 adjacent to the center portion with radiation heat in an initial operating stage.

An observation window 16 is provided in the wall of the bell jar 3 and the surface temperature of the rod in the reactor 1 can be measured by a radiation thermometer 17 (a thermometer 17) from the outside.

The bottom plate 2 and the bell jar 3 of the reactor 1 are formed in a double-walled structure and coolant can be circulated in interior space portions 2a and 3a thereof. The reference number 18 in FIG. 1 represents a coolant supply tube and the reference number 19 represents a coolant discharge tube.

A method of producing polycrystalline silicon by using the polycrystalline silicon producing apparatus constituted as described above will be described.

First, by supplying electric current to the electrodes 5 which are connected to the silicon seed rods 4 and the heater 15 disposed at the center of the reactor 1, the heater 15 and silicon seed rods 4 generate heat. At this time, since the heater 15 is made of carbon, the heater generates heat earlier than the silicon seed rods 4. When the temperature of silicon seed rods 4 is increased by the radiation heat from the heater 15, the adjacent silicon seed rods 4 (adjacent to the center portion of the reactor) become conductive, the adjacent silicon seed rods 4 are also in a resistance heat-generation state due to the electric current from the electrodes 5 thereof. The heat is gradually transferred in a radial direction or the like of the reactor 1 from the silicon seed rods 4 adjacent to the center portion of the reactor, and finally, the electric current is supplied to all the silicon seed rods 4 in the reactor 1 and enter a heat-generation state. By increasing the temperature of the silicon seed rods 4 up to a decomposition temperature of the raw material gas, the raw material gas ejected from the ejection nozzles 6 is heated and decomposed or hydrogen reduction reaction on the surfaces of the silicon seed rods 4 and polycrystalline silicon is deposited on the surfaces of the silicon seed rods 4. The deposited polycrystalline silicon grows in the radial direction and thus becomes a polycrystalline silicon rod R as shown by the chain line of FIG. 1. The discharge gas after supply to the deposition of the polycrystalline silicon is sent to the discharge gas processing system 11 from the gas discharge port 7 in the inner bottom portion of the reactor 1.

Figure 2A:
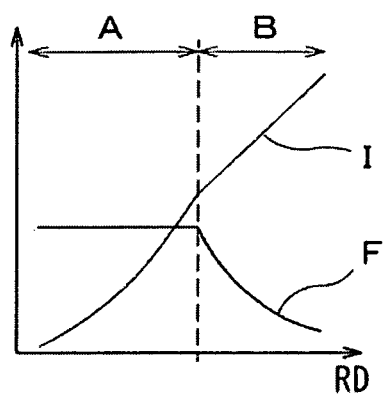
FIGS. 2A and 2B are graphs showing changes in the control state of a first process and a second process of the producing method of the present invention.
Figure 2B:
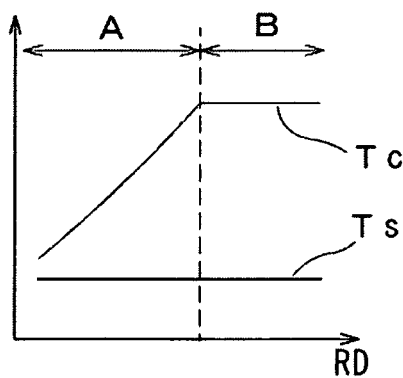

In the polycrystalline silicon producing process, a value of the electric current supplying the silicon seed rods 4 and a supply amount of chlorosilanes in the raw material gas are controlled, and in the present invention, the controlling is performed by dividing the process into a first process and a second process. FIG. 2A shows changes of a current value I and a supply amount F of chlorosilanes per square millimeter of the surface of the rod R (total chlorosilane supply amount (mol/sec)/total surface area of rod R ($mm^2$)) in the producing process. FIG. 2B shows changes of a center temperature Tc and a surface temperature Ts of the rod R. The area A represents the first process and the area B represents the second process. Hereinafter, regarding the first process and the second process of this embodiment and the control method will be described in detail with reference to FIGS. 2A and 2B. Herein, the chlorosilanes have trichlorosilane as a main component. However, monochlorosilane, dichlorosilane, silicon tetrachloride, polymers (for example, $Si_2Cl_6$) and the like may be included therein.

<First Process>

In order to uniformly deposit polycrystalline silicon over the entire surface of the rod, as shown by the area A of FIG. 2A, a supply amount F of chlorosilanes per square millimeter of the surface of the rod (total chlorosilane supply amount (mol/sec)/total surface area of rod R ($mm^2$)) is maintained so as to be substantially constant in the range equal to or greater than $2.0 \times 10^{-7}$ mol/sec/$mm^2$ and equal to or less than $3.5 \times 10^{-7}$ mol/sec/$mm^2$. This amount is larger than the supply amount in a conventional process of a normal pressure type. Accordingly, with an increasing diameter RD (hereinafter, referred to as a rod diameter RD) of the rod R, a supply amount of the raw material gas supplied to the vicinity of the rod R and a supply amount of chlorosilane are increased.

The pressure in the reactor 1 is adjusted to be equal to or greater than 0.4 MPa and equal to or less than 0.9 MPa (absolute pressure). This pressure is maintained over the process from the first process to the second process. When the pressure is too low, the yield decreases over the entire process. In addition, to compensate a pressure loss, a pipe diameter is increased to cause a large amount of the gas to flow and thus the structure of the under side of the reactor or the bottom plate of the reactor becomes complicated. The upper limit of the pressure is decided on the basis of the pressure capacity of the reactor 1.

In addition to the adjustment of the supply amount of the raw material gas, the current value I is adjusted so that the surface temperature Ts of the rod R is maintained so as to be substantially constant in the range equal to or higher than 1000° C. and equal to or lower than 1100° C.

When the surface temperature Ts is increased, the growing rate of polycrystalline silicon can be improved. However, the current value I is increased with the increasing rod diameter RD. Accordingly, the center temperature Tc (average center temperature Tc) of the rod R is increased with the increasing rod diameter RD as shown by the area A of FIG. 2B. It is preferable that the surface temperature Ts is in the above range in consideration of an effect of promoting the deposition of polycrystalline silicon, the center temperature Tc of the rod R, a final rod diameter and the like.

As long as the center temperature Tc does not reach the melting point of polycrystalline silicon, the raw material gas can be supplied in a large amount and producing at a high pressure can be achieved. Accordingly, the center temperature Tc of the rod R is monitored, and until the center temperature is at a temperature of equal to or higher than 1200° C. and equal to or lower than 1300° C., which is lower than the melting point of polycrystalline silicon, the amount of raw material gas supply (supply amount F of chlorosilanes) and the current value I are adjusted in the same manner.

Figure 3:
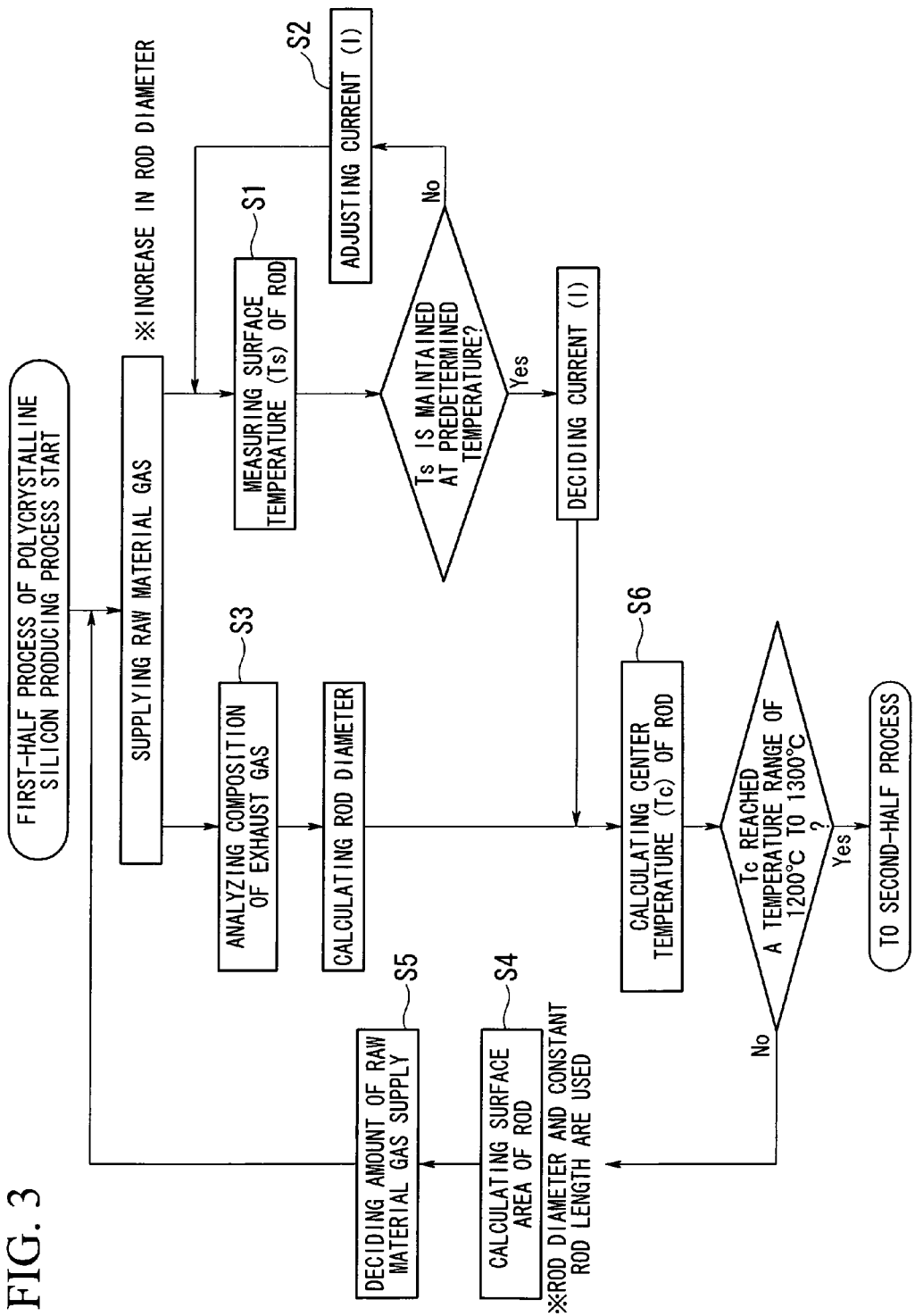
FIG. 3 is a block diagram showing an example of the control operation in the first process of the producing method of the present invention.

The center temperature Tc of the rod R is calculated on the basis of the surface temperature Ts of the rod R, rod diameter RD, current value I and physical properties (specific resistance, thermal conductivity) of polycrystalline silicon in accordance with the flowchart shown in FIG. 3. The following reference symbols S1 to S6 correspond to the steps in FIG. 3.

The surface temperature Ts of the rod R is measured by the radiation thermometer 17 from the observation window 16 of the reactor 1 (S1). By controlling (adjusting) the electric current value I supplying the silicon seed rod 4, the surface temperature Ts of the rod R is maintained so as to be substantially constant in the range equal to or higher than 1000° C. and equal to or lower than 1100° C. (S2). The current value I is gradually adjusted, and the current value I, which maintains the surface temperature Ts to be constant, is used as a parameter for obtaining the center temperature Tc of the rod R to be described later.

Meanwhile, the rod diameter RD is measured by a diameter measuring device (40). In the diameter measuring device (40), for example, the composition of the discharge gas from the reactor 1 is analyzed by a gas chromatograph or the like, and from the relationship with an accumulated amount of the supply of chlorosilanes, the weight of the deposited polycrystalline silicon is obtained to calculate the rod diameter RD by the weight (S3). By the rod diameter RD and the length of the rod R (constant value), the surface area of the rod R is obtained (S4). On the basis of the surface area of the rod R and the above-described supply amount F of chlorosilanes per square millimeter of the surface of the rod, the supply amount of the raw material gas is obtained (S5).

On the basis of the surface temperature Ts of the rod R, rod diameter RD, current value I and physical properties (specific resistance, thermal conductivity) of polycrystalline silicon, the temperature distribution in the rod is calculated in consideration of the resistance heat-generation quantity generated by the current in the rod and the heat transfer in the rod (the heat transfer of the circular tube) to obtain the center temperature Tc of the rod R (S6). In this case, the specific resistance or the thermal conductivity as physical properties of polycrystalline silicon has temperature dependence and a generally known value may be used therefor. However, in a range covering the surface temperature Ts and the center temperature Tc during the manufacturing process, the relationship between the specific resistance or the thermal conductivity of polycrystalline silicon and the temperature may be examined in advance.

The center temperature Tc of the rod R obtained by the above-described method is an average temperature of the center portion of the rod in which the surface temperature has been measured, the connecting member connected thereto and another rod connected to the connecting member.

The meltdown of a polycrystalline silicon rod occurs because, for example, in a region such as a connecting point between the polycrystalline silicon rod and a connecting member, the temperature locally increases and the temperature at the center portion thereof becomes equal to or higher than the melting point. Accordingly, by using the average center temperature Tc of the rod, which is obtained by the above-described method, the temperature at which the melt down of the rod occurs is monitored and controlled to prevent the meltdown. In this case, the temperature of the connected region is higher than the average center temperature Tc. That is, the meltdown can be prevented by controlling the average center temperature Tc to a temperature lower than 1410° C., which is the melting point of polycrystalline silicon. Although depending on the coupling degree of the coupled portion, the shape of the silicon seed rod, the length of the used silicon seed rod and the like, in order to prevent the meltdown, the average center temperature Tc may be equal to or higher than 1200° C. and equal to or lower than 1300° C.

In this mariner, the average center temperature Tc of the rod R is calculated, and while the average center temperature is monitored, the current value I and the amount of raw material gas supply (supply amount F of chlorosilanes) are controlled as described above until the average center temperature Tc is equal to or higher than 1200° C. and equal to or lower than 1300° C.

From the stage in which the average center temperature Tc of the rod R reaches the above-described temperature range, the controlling is performed as follows.

<Second Process>

Figure 4:
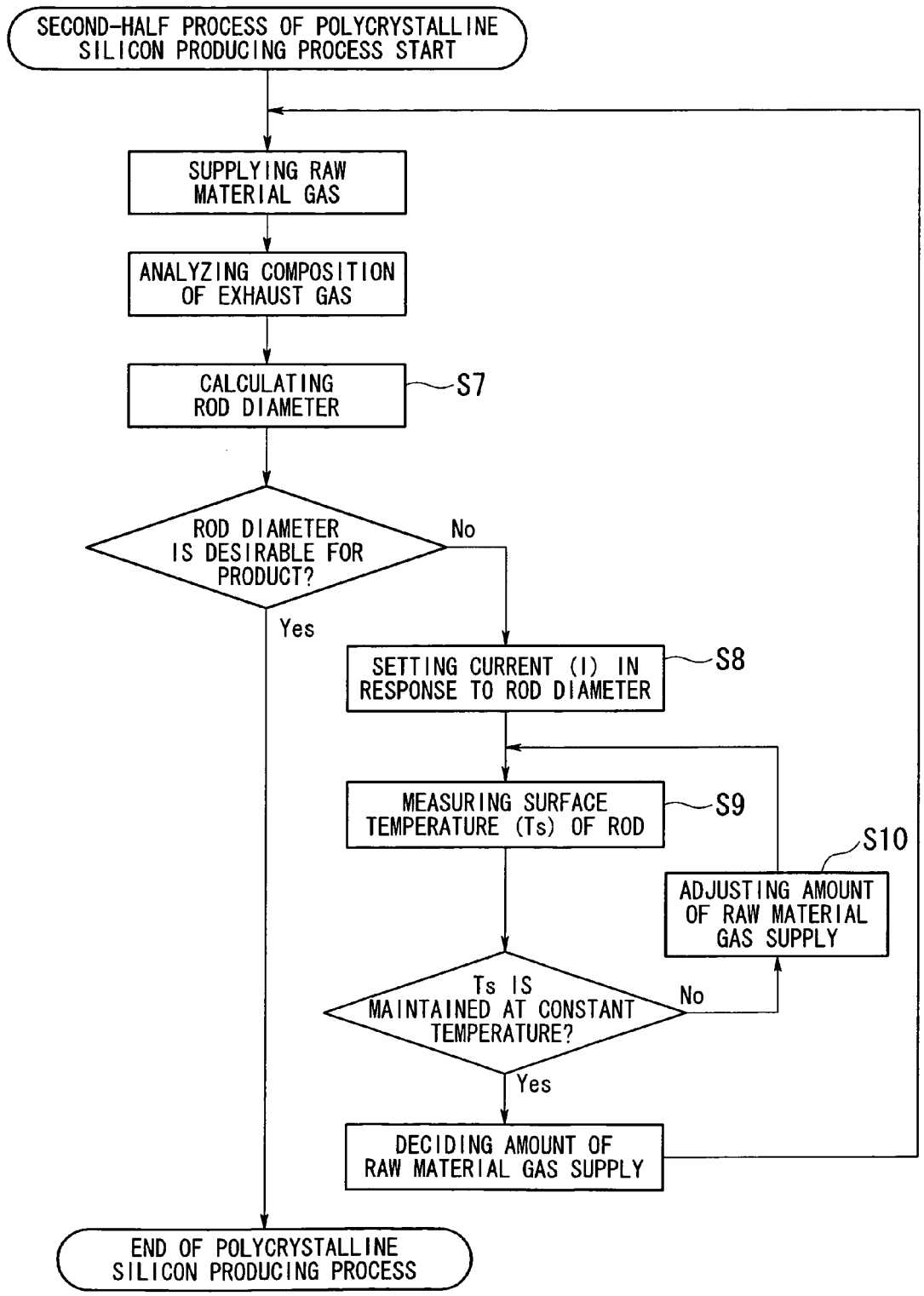
FIG. 4 is a block diagram showing an example of the control operation in the second process of the producing method of the present invention.

The content of the controlling in the second process is organized in the flowchart of FIG. 4.

Figure 5:
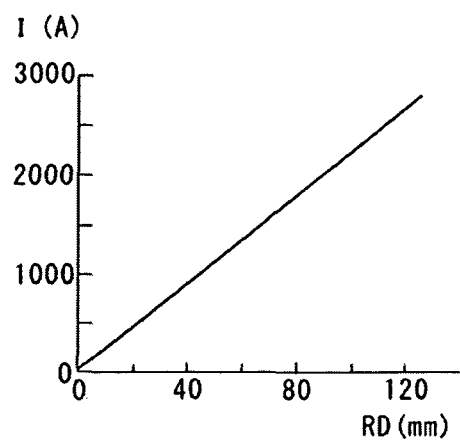
FIG. 5 is a graph showing the relationship between the rod diameter RD and the current value I in the second process of the producing method of the present invention.

As in the case of the first process, the discharge gas from the reactor 1 is analyzed by a gas chromatograph or the like to calculate the rod diameter RD (S7). Corresponding to the rod diameter RD, the previously obtained current value I is set (S8). The current value I is obtained corresponding to each rod diameter RD on the basis of the surface temperature Ts of the rod R that should be maintained, the average center temperature Tc of the rod R and the physical properties (specific resistance, thermal conductivity) of a polycrystalline silicon. For example, when the average center temperature Tc of the rod R is adjusted to 1250° C. and the surface temperature Ts of the rod R is adjusted to 1100° C., the current value I (A) is obtained corresponding to each rod diameter RD (mm) as shown in FIG. 5. A final rod diameter RD is not particularly limited. However, in consideration of the fact that when polycrystalline silicon rods for producing singlecrystalline silicon for use in semiconductors have a large rod diameter, the singlecrystalline silicon can be efficiently produced, as well as the growing rate in the polycrystalline silicon producing and the like, if the rod diameter RD is equal to or greater than 100 mm and equal to or less than 150 mm, the producing of polycrystalline silicon can be completed.

In addition, while the surface temperature Ts of the rod R is measured (S9), the amount of raw material gas supply (supply amount F of chlorosilanes) is adjusted (S10) so that the surface temperature Ts is substantially constant in the range of 1000° C. to 1100° C. At this time, the supply amount F of chlorosilanes per square millimeter of the surface of the rod R is decreased with the increasing rod diameter RD as shown by the area B of FIG. 2A. As is shown by the area B, the surface temperature Is and the average center temperature Tc of the rod R are maintained to be within predetermined ranges, respectively.

As described above, the amount of raw material gas supply and the current value are controlled so that the surface temperature and the average temperature of the center portion of the rod are in desired ranges. That is, in the second process, as the current value, a value previously determined with respect to a rod diameter is used so that the average temperature of the center portion of the rod is not increased up to the temperature at which the meltdown occurs, and the raw material gas is supplied in a supply amount depending on the current value and the surface temperature of the rod.

By the above controlling, the average temperature of the center portion of the rod is suppressed in a predetermined range and the meltdown is thus prevented, and by maintaining the surface temperature at a predetermined range, a rod having a large diameter and a smooth surface can be produced with a high yield.

The above description that the surface temperature Ts and the average center temperature Tc of the rod can be controlled by controlling the current value I and the amount of raw material gas supply (supply amount F of chlorosilanes) is based on the following theory.

Figure 6:
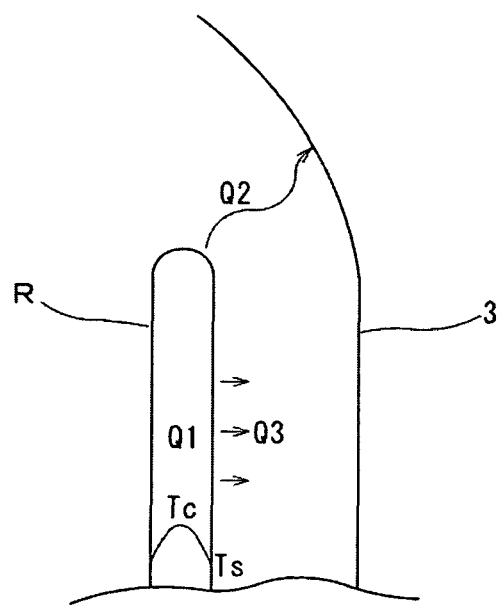
FIG. 6 is a schematic diagram for explaining the heat balance of the rod in the reactor.

When considering the heat balance of a rod of polycrystalline silicon, as schematically shown in FIG. 6, it is necessary to consider a resistance heat-generation quantity Q1 which is generated by applying a current to the rod R, a heat quantity Q2 escaping to the wall (bell jar) 3 of the reactor by the radiation from the surface of the rod and a heat quantity Q3 escaping from the surface of the rod to the gas by the convection heat transfer. These heat quantities are required to satisfy the following relationship.

$$Q1=Q2+Q3 \quad \text{(Equation 1)}$$

The heat quantities are decided by the following variables.

$$Q1=f(Ts, Tc, I, V, RD)$$

$$Q2=f(Ts, RD)$$

$$Q3=f(F, As, Ts)$$

Herein, the reference symbol Ts denotes a surface temperature of the rod, the reference symbol Tc denotes an average temperature of the center portion of the rod, the reference symbol I denotes a current, the reference symbol V denotes a voltage, the reference symbol RD denotes a rod diameter, the reference symbol F denotes a supply flow rate of chlorosilanes (or the raw material gas), and the reference symbol As denotes a surface area of the rod. The number of rods and the length thereof are constant.

Regarding the resistance heat-generation quantity Q1, when the surface temperature Ts, rod diameter RD, and any one of average center temperature Tc, current value I and voltage V are decided among Q1=f(Ts, Tc, I, V, RD), Q1 and the remaining variables are decided. For example, if it is desirable to maintain a state of Ts=1100° C. in a certain state of the rod diameter RD, (1) when the average center temperature Tc is desired equal to 1250° C., Q1, the current I to be applied and the voltage V at the time are decided.

(2) when the current value I is adjusted to 3000 A, Tc, V and Q1 are decided.

In order to realize the above state, a total value of Q2 and Q3 is required to be equal to the heat quantity of Q1 on the basis of the heat balance of Equation 1.

Herein, the surface temperature Ts and the average center temperature Tc are desirably maintained as in the condition (1) in the second process. In the condition (1), Ts=1100° C. and Tc=1250° C. are desirable. The current value I to be applied at this time and the value of the heat-generation quantity Q1 of the rod are obtained.

In addition, since the surface temperature Ts and the rod diameter RD are decided, the value of the heat quantity Q2 escaping to the wall is decided. Regarding the heat quantity Q3 escaping by the convection heat transfer, since the surface area As of the rod and the surface temperature Ts of the rod are decided, the supply flow rate F of chlorosilanes (or the raw material gas) can be adjusted. For the above-described reason, when the supply flow rate F of chlorosilanes (or the raw material gas) is adjusted in a state in which the current value I to be applied is applied, the surface temperature Ts of the rod and the average center temperature Tc of the rod of the condition (1) can be maintained on the condition that a total value of Q2 and Q3 is equal to Q1.

Figure 7:
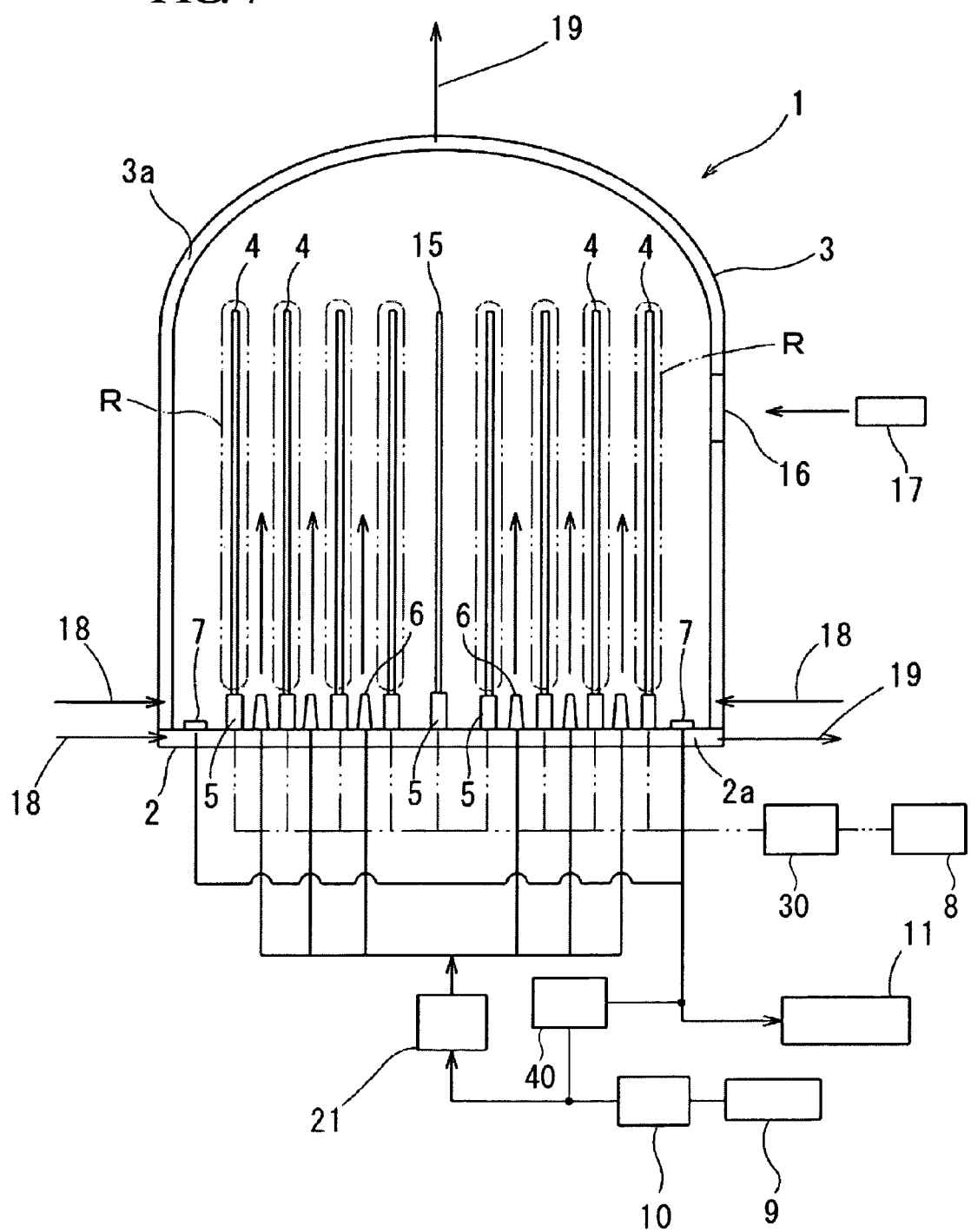
FIG. 7 is a configuration diagram showing a producing apparatus which is used in a polycrystalline silicon producing method according to another embodiment of the present invention.

FIG. 7 shows another embodiment of the polycrystalline silicon producing apparatus of the present invention. The polycrystalline silicon producing apparatus shown in FIG. 7 is provided with a pre-heater 21 for heating raw material gas before the raw material gas is supplied to the reactor 1.

As in the polycrystalline silicon producing apparatus according to this embodiment, by pre-heating the raw material gas to be supplied to the reactor 1, the heat loss from the rod to the gas is decreased and the rod can be more rapidly grown. A pre-heating temperature can be equal to or higher than 200° C. and equal to or lower than 600° C.

Figure 8:
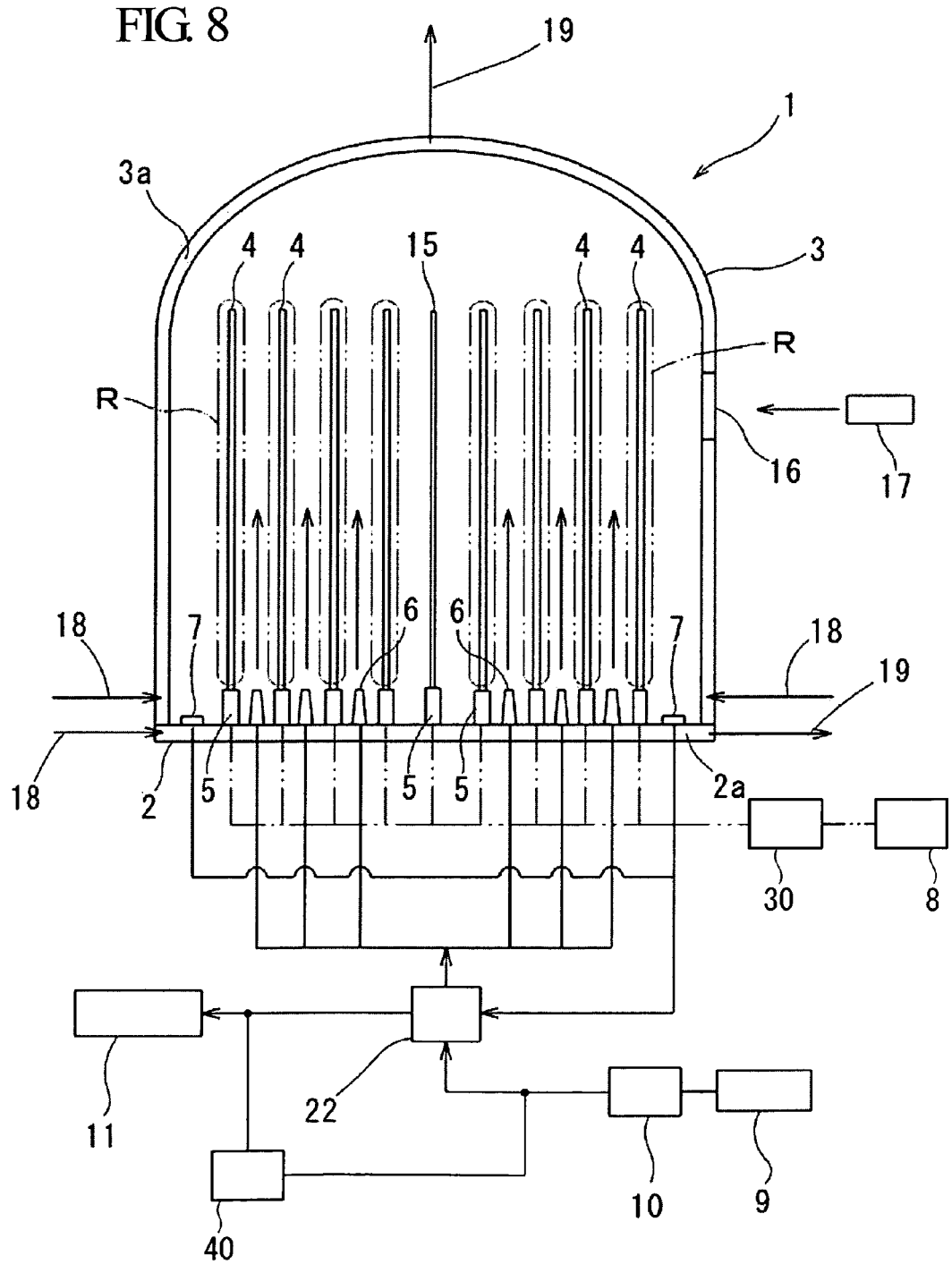
FIG. 8 is a configuration diagram showing a producing apparatus which is used in a polycrystalline silicon producing method according to yet another embodiment of the present invention.

As in the yet another embodiment shown in FIG. 8, a configuration may be employed in which raw material gas supplied to the reactor 1 and a high-temperature discharge gas discharged from the reactor 1 are heat-exchanged by a pre-heater 22.

In FIGS. 7 and 8, the same parts as those in FIG. 1 will be denoted by the same symbols and description thereof will be omitted.

Examples

Next, specific examples will be described.

In the following examples of the polycrystalline silicon producing process, a reactor was supplied with raw material gas, in which chlorosilanes including trichlorosilane as a main component and 4.5 mol % of dichlorosilane ($SiH_2Cl_2$) were used and mixed with hydrogen ($H_2$), so as to have a molar ratio of $H_2$/chlorosilanes of 8. A pressure and a supply amount of chlorosilanes per square millimeter of the surface of the rod were set as shown in Tables 1 and 2 and a current value was adjusted so that a surface temperature Ts of the rod was 1100° C. Table 1 shows examples and Table 2 shows comparative examples. The temperature of the supplying raw material gas was adjusted to 100° C. and the temperature of an inner surface of the reactor was adjusted to 200° C.

Figure 10A:
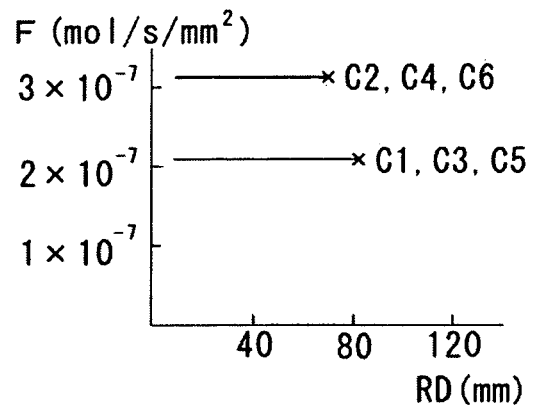
FIGS. 10A to 10C are graphs showing changes in the control state when a current value and a supply amount of chlorosilanes were not adjusted in comparative examples.
Figure 10B:
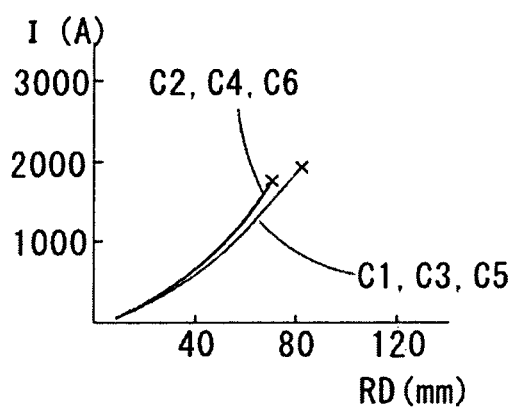
Figure 10C:
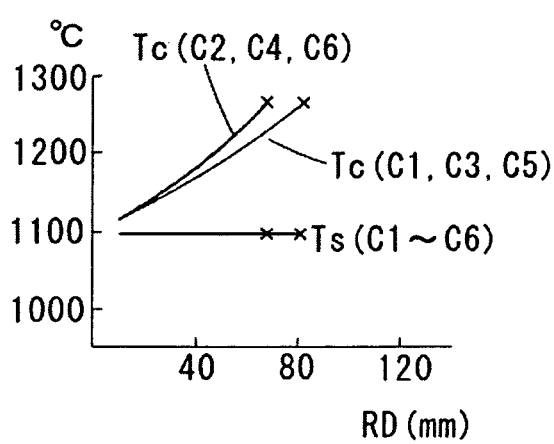

In the comparative examples, as shown in FIG. 10A, a supply amount F of chlorosilanes per square millimeter of the surface of the rod was constant and a current value I was increased with an increasing rod diameter RD as shown in FIG. 10B. At this time, an average center temperature Tc of the rod changed as shown in FIG. 10C. The adjustment of the current value and the gas flow rate with the increasing average center temperature Tc was not performed.

As shown in FIGS. 10A to 10C, in the comparative examples, meltdown occurred before the rod diameter RD reached 100 mm and it was not possible to further grow the rod (in FIGS. 10A to 10C, the mark x denotes meltdown). The final rod diameter shown in Table 2 is a rod diameter at the time when the meltdown occurs. An average temperature of the center portion of the rod at the time when the meltdown occurred was equal to or higher than 1255° C. and equal to or lower than 1265° C.

Figure 9A:
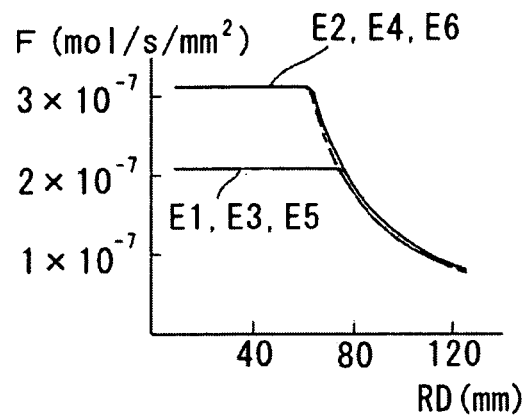
FIGS. 9A to 9C are graphs showing changes in the control state of a first process and a second process of the producing method of examples E1 to E6 of the present invention.
Figure 9B:
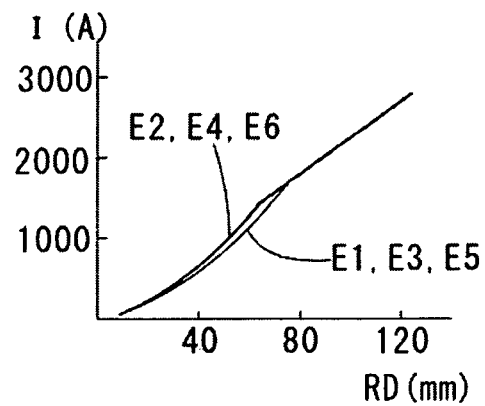
Figure 9C:
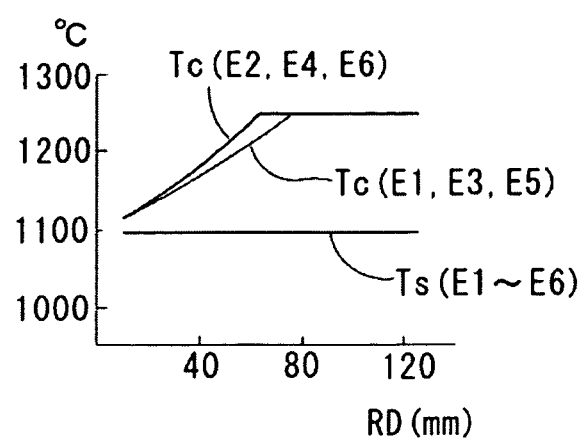

In this respect, in the examples, as shown in FIGS. 9A to 9C, from the time point when an average center temperature Tc of the rod reached 1250° C., a supply amount F of chlorosilanes, a supply amount of hydrogen, and a current value I were adjusted so that a surface temperature Ts of the rod was maintained at 1100° C. and an average center temperature Tc was maintained at 1250° C. to grow the rods. The supply amount of hydrogen is not shown figures, however the amount of hydrogen was adjusted so that the molar ratio of $H_2$/chlorosilanes is maintained substantially at 8. In all the examples, the growing reaction ended at the time when a rod diameter exceeded 125 mm. In addition, the supply amount of chlorosilanes and hydrogen per square millimeter of the surface of the rod immediately before the end of reaction was about one half to one third of the supply amount of chlorosilanes and hydrogen per square millimeter of the surface of the rod at the time when the process switched to the second process from the first process.

In Table 1, yield is a proportion (mol %) of the total polycrystalline silicon deposition amount to the total supply amount of chlorosilanes (total polycrystalline silicon deposition amount (mol)/total supply amount of chlorosilanes (mol)). The polycrystalline silicon deposition amount per unit time and unit of chlorosilanes (total polycrystalline silicon (Si) deposition amount (g)/(total supply amount of chlorosilanes (g)/producing time (hr))) is a value indicating a growth rate.

TABLE 1

| Example | Supply amount of chlorosilanes per square millimeter of the surface of the rod in first process ×$10^{-7}$ [mol/sec/mm$^2$] | Pressure [MPa] | Surface temperature [° C.] | Adjustment of current & gas flow rate | Final rod diameter [mm] | Yield [mol %] | Si deposition amount per unit time and unit of chlorosilanes ×$10^{-4}$ [g (Si)/g (chlorosilanes)/hr] |
|---|---|---|---|---|---|---|---|
| E1 | 2.1 | 0.4 | 1100 | Adjusted | 126 | 11 | 2.9 |
| E2 | 3.1 | 0.4 | 1100 | Adjusted | 126 | 11 | 3.0 |
| E3 | 2.1 | 0.6 | 1100 | Adjusted | 125 | 12 | 3.2 |
| E4 | 3.1 | 0.6 | 1100 | Adjusted | 126 | 11 | 3.4 |
| E5 | 2.1 | 0.9 | 1100 | Adjusted | 126 | 12 | 3.5 |
| E6 | 3.1 | 0.9 | 1100 | Adjusted | 125 | 11 | 3.7 |

TABLE 2

| Comparative example | Supply amount of chlorosilanes per square millimeter of the surface of the rod ×$10^{-7}$ [mol/sec/mm$^2$] | Pressure [MPa] | Surface temperature [° C.] | Adjustment of current & gas flow rate | Final rod diameter [mm] |
|---|---|---|---|---|---|
| C1 | 2.1 | 0.4 | 1100 | None | 78 |
| C2 | 3.1 | 0.4 | 1100 | None | 67 |
| C3 | 2.1 | 0.6 | 1100 | None | 80 |

TABLE 2-continued

| Comparative example | Supply amount of chlorosilanes per square millimeter of the surface of the rod ×10$^{-7}$ [mol/sec/mm$^2$] | Pressure [MPa] | Surface temperature [° C.] | Adjustment of current & gas flow rate | Final rod diameter [mm] |
|---|---|---|---|---|---|
| C4 | 3.1 | 0.6 | 1100 | None | 68 |
| C5 | 2.1 | 0.9 | 1100 | None | 81 |
| C6 | 3.1 | 0.9 | 1100 | None | 68 |

As is shown by the above results, in the comparative examples, before the rod diameter reached 100 mm, the average temperature of the center portion of the rod was increased and meltdown occurred. However, in the examples in which the supply amount F of chlorosilanes and the current value I were adjusted after the average temperature of the center portion of the rod reached 1250° C., it was possible to increase the rod diameter to 100 mm or larger in all the cases.

Figure 11A:
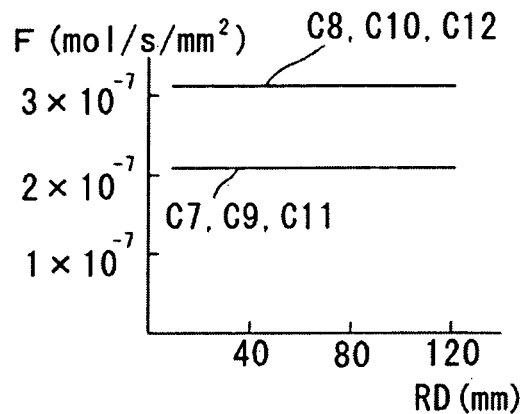
FIGS. 11A to 11C are graphs showing changes in the control state when only a current value was adjusted in comparative examples.
Figure 11B:
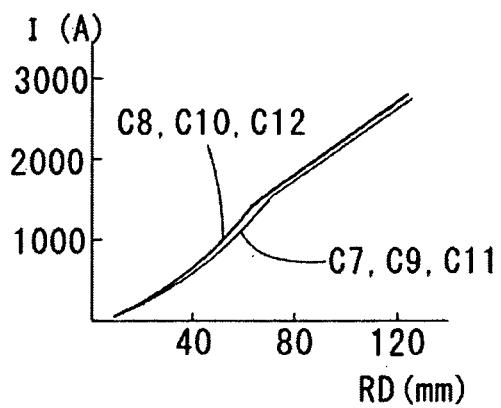
Figure 11C:
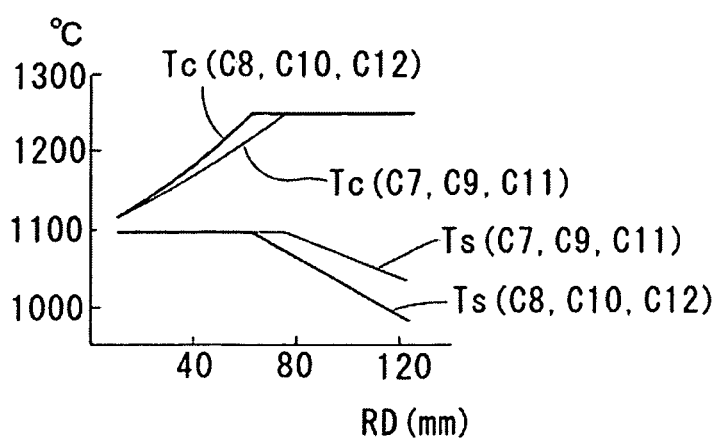

Next, the following examination was carried out to verify the effect of the adjustment in the supply amount F of chlorosilanes and the current value I in the second of the process. That is, as in the case of Tables 1 and 2, the raw material gas is supplied in the reactor, in which chlorosilanes including trichlorosilane as a main component and 4.5 mol % of dichlorosilane ($SiH_2Cl_2$) were used and mixed with $H_2$, so as to have a molar ratio of $H_2$/chlorosilanes of 8. A pressure and a supply amount of chlorosilanes per square millimeter of the surface of the rod were set as in Table 2 and a current value was adjusted so that a surface temperature Ts of the rod was 1100° C. in the first of the process. As shown in FIGS. 11A to 11C, from the time point when an average center temperature Tc of the rod reached 1250° C., only a current value I was adjusted so that the average center temperature Tc did not exceed 1250° C. As in the examples of Table 1, the growing reaction was made to end at the time when a rod diameter exceeded 125 mm. The final rod diameter, yield and polycrystalline silicon deposition amount per unit time and unit of chlorosilanes were examined and the results thereof are shown in Table 3. The supply temperature of the raw material gas was adjusted to 100° C. and the temperature of an inner surface of the reactor was adjusted to 200° C.

the rod at 1250° C., the surface temperature of the rod decreased. In the comparative example C11, the Si deposition amount per unit time and unit of chlorosilanes is the same as in the example E1, but the yield is low. Accordingly, in order to increase the yield and the growth rate together, it is effective to adjust both the current value and the supply amount of the raw material gas.

Next, tests of examples E7 and E8 were performed.

Also in the examples E7 and E8, as in other examples, a reactor was supplied with raw material gas, in which chlorosilanes including trichlorosilane as a main component and 4.5 mol % of dichlorosilane were used and mixed with $H_2$, so as to have a molar ratio of $H_2$/chlorosilanes of 8. A surface temperature of the rod was adjusted to 1100° C. and a supply amount of chlorosilanes per square millimeter of the surface of the rod was adjusted to 3.1×10$^{-7}$ mol/sec/mm$^2$. In the example E7, the pressure was 0.9 MPa, and in the example E8, the pressure was 0.6 MPa. After an average center temperature Tc of the rod reached 1200° C. in the example E7 and reached 1300° C. in the example E8, the supply amount of gas of chlorosilanes and hydrogen, and the current value were adjusted so that in the second of the process, the surface temperature Ts of the rod was maintained at 1100° C. and the average center temperature Tc was maintained at 1200° C. in the example E7 and maintained at 1300° C. in the example E8. In this case, in the example E8, a suitable means (for example, welding) was employed so that the temperature increase of the connecting portion between a silicon seed rod and a connecting member was suppressed in order to prevent the temperature from reaching nearly 1410° C. (melting point of silicon).

TABLE 3

| Comparative example | Supply amount of chlorosilanes per square millimeter of the surface of the rod ×10$^{-7}$ [mol/sec/mm$^2$] | Pressure [MPa] | Surface temperature in first process [° C.] | Final rod diameter [mm] | Yield [mol %] | Si deposition amount per unit time and unit of chlorosilanes ×10$^{-4}$ [g (Si)/g (chlorosilanes)/hr] |
|---|---|---|---|---|---|---|
| C7 | 2.1 | 0.4 | 1100 | 126 | 8 | 2.3 |
| C8 | 3.1 | 0.4 | 1100 | 126 | 5 | 1.4 |
| C9 | 2.1 | 0.6 | 1100 | 125 | 9 | 2.7 |
| C10 | 3.1 | 0.6 | 1100 | 126 | 6 | 1.9 |
| C11 | 2.1 | 0.9 | 1100 | 126 | 9 | 2.9 |
| C12 | 3.1 | 0.9 | 1100 | 125 | 6 | 2.1 |

Figure 12A:
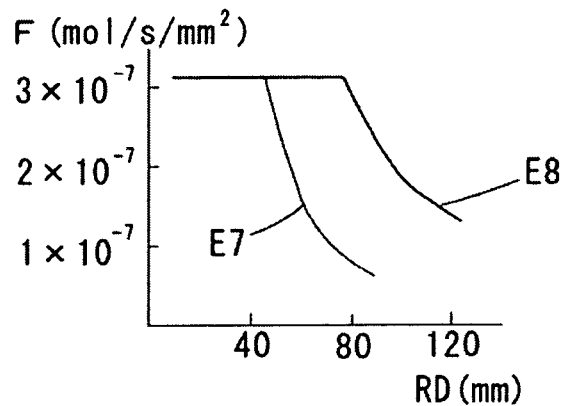
FIGS. 12A to 12C are graphs showing changes in the control state of a first process and a second process of the producing method of examples E7 to E9 of the present invention.
Figure 12B:
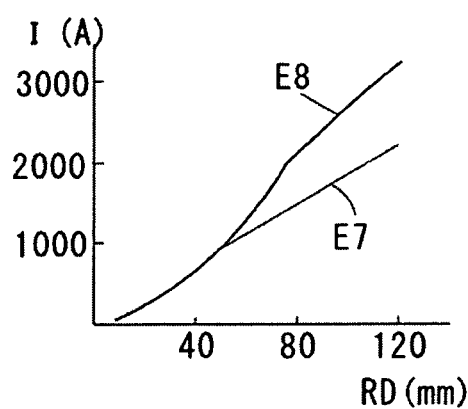
Figure 12C:
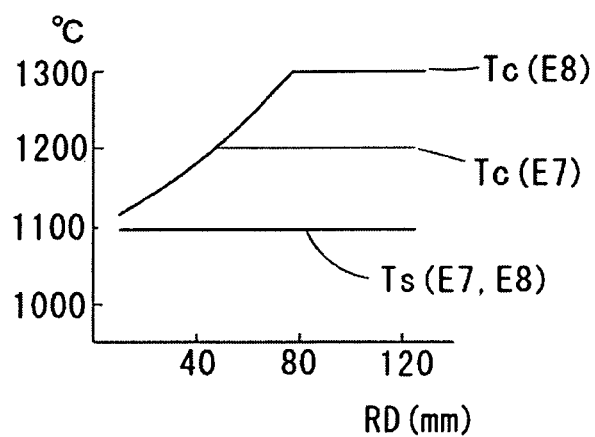

As shown in Table 3, it was possible to increase the rod diameter to 100 mm or larger. However, the yield was in the range of 5 to 9 mol %, and except for the comparative example C11, the Si deposition amount per unit time and unit of chlorosilanes were in the range of 1.4 to 2.7×10$^{-4}$ [g (Si)/g (chlorosilanes)/hr]. This is worse than in the examples of Table 1. The reason is that since only the current was adjusted to maintain the average temperature of the center portion of The results of the examples E7 and E8 are shown in Table 4. The supply amount of chlorosilanes per square millimeter of the surface of the rod, current value, surface temperature Ts of the rod and average center temperature Tc of the rod with respect to the silicon rod diameter are shown in FIGS. 12A to 12C. The supply amount of hydrogen is not shown figures, however the amount of hydrogen was adjusted so that the molar ratio of $H_2$/chlorosilanes is maintained substantially at 8.

TABLE 4

| Examples | Supply amount of chlorosilanes per square millimeter of the surface of the rod in first process ×10⁻⁷ [mol/sec/mm²] | Pressure [MPa] | Surface temperature [° C.] | Highest center temperature [° C.] | Adjustment of current & gas flow rate | Final rod diameter [mm] | Yield [mol %] | Si deposition amount per unit time and unit of chlorosilanes ×10⁻⁴ [g (Si)/g (chlorosilanes)/hr] |
|---|---|---|---|---|---|---|---|---|
| E7 | 3.1 | 0.9 | 1100 | 1200 | Adjusted | 126 | 14 | 3.1 |
| E8 | 3.1 | 0.6 | 1100 | 1300 | Adjusted | 125 | 10 | 3.7 |

As shown in Table 4, it was possible to increase the rod diameter to 100 mm or larger and it was possible to grow polycrystalline silicon with a higher yield than in the comparative examples C7 to C12. In the example E7, it was possible to grow a polycrystalline silicon with a higher yield and with a larger polycrystalline silicon deposition amount per unit time and unit of chlorosilanes than in the comparative example C12 in which the same supply amount of chlorosilanes per square millimeter of the surface of the rod and the same pressure were given.

As comparative examples with respect to the example E8, a comparative example C13 in which the current value and the gas flow rate are not adjusted and a comparative example C14 in which only the current value is adjusted so that the temperature of the center portion of the rod does not exceed 1300° C. in the second process were tested. As in other examples, a reactor was supplied with raw material gas, in which chlorosilanes including dichlorosilane as a main component and 4.5 mol % of dichlorosilane were used and mixed with $H_2$, so as to have a molar ratio of $H_2$/chlorosilanes of 8. A surface temperature of the rod was adjusted to 1100° C., a supply amount of chlorosilanes per square millimeter of the surface of the rod was adjusted to $3.1 \times 10^{-7}$ mol/sec/mm² and a pressure was adjusted to 0.6 MPa. As in the example E9, in the comparative examples C13 and C14, a suitable means (for example, welding) was employed so that the temperature increase of the connecting portion between a silicon seed rod and a connecting member was suppressed in order to prevent the temperature from reaching nearly 1410° C.

Table 5 shows the results of the comparative example 13 and Table 6 shows the results of the comparative example 14.

Figure 13A:
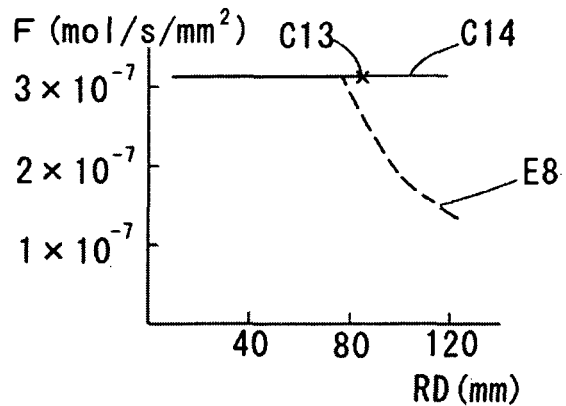
FIGS. 13A to 13C are graphs showing changes in the control state of a comparative example C13 in which a current value and a supply amount of chlorosilanes were not adjusted and of a comparative example E14 in which only a current value was adjusted with respect to an example E8.
Figure 13B:
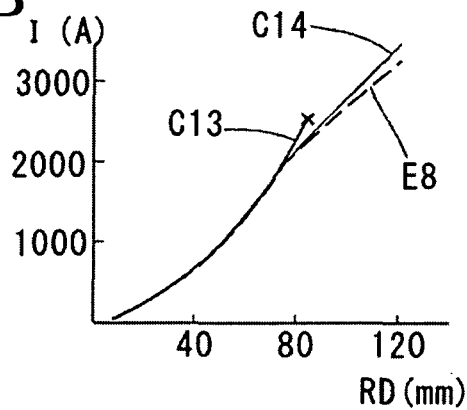
Figure 13C:
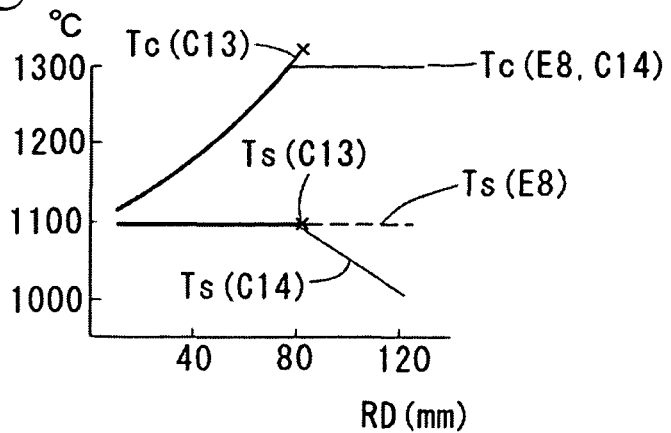

Changes in the supply amount F of chlorosilanes per square millimeter of the surface of the rod, current value I, surface temperature Ts of the rod and center temperature Tc with respect to the rod diameter RD are shown in FIGS. 13A to 13C. In FIGS. 13A to 13C, the results of the example E8 are also displayed and overlapped for comparison.

In the comparative example C13, it was not possible to grow the rod to have a rod diameter of 100 mm or larger, and the meltdown occurred when the rod diameter was increased to 85 mm. The meltdown temperature was 1322° C. In the comparative example 14 in which the current value was adjusted, although it was possible to increase the rod diameter to 100 mm or larger, both the polycrystalline silicon deposition amount per unit time and unit of chlorosilanes and the yield were more deteriorated than in the example E9.

Next, by adjusting the temperature and flow rate of the coolant circulated in the double-walled interior space of the reactor, the temperature of the inner wall of the reactor was maintained at 250° C., 300° C. and 400° C. and examples E9, E10 and E11 were tested. As in other examples, a reactor was supplied with raw material gas, in which chlorosilanes including trichlorosilane as a main component and 4.5 mol % of dichlorosilane were used and mixed with $H_2$, so as to have a molar ratio of $H_2$/chlorosilanes of 8. A surface temperature of the rod was adjusted to 1100° C., a supply amount of chlorosilanes per square millimeter of the surface of the rod was adjusted to $3.1 \times 10^{-7}$ mol/sec/mm² and the pressure was adjusted to 0.6 MPa.

In addition, after an average center temperature Tc of the rod reached 1250° C., the supply amount of gas of chlorosilanes and hydrogen, and the current value were adjusted so that in the second of the process, the surface temperature Ts of the rod was maintained at 1100° C. and the average center temperature Tc was maintained at 1250° C. The supply temperature of the raw material gas was adjusted to 100° C.

Figure 14A:
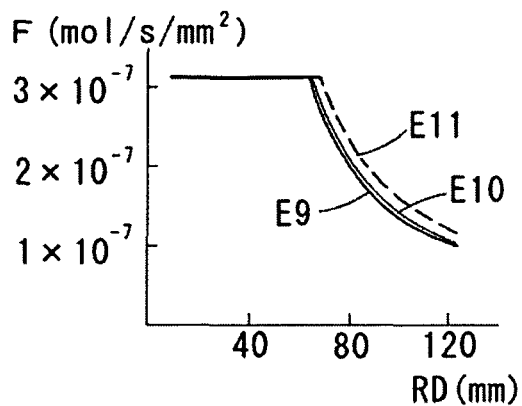
FIGS. 14A to 14C are graphs showing changes in the control state of a first process and a second process of the producing method of examples E9, E10 and E11 of the present invention.
Figure 14B:
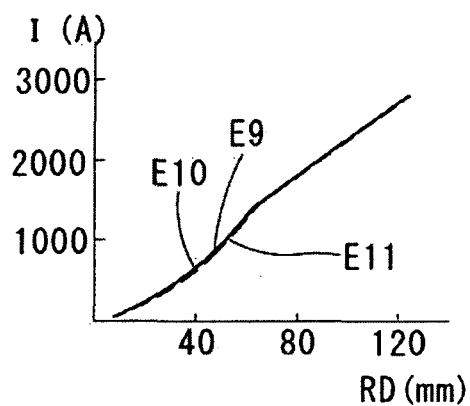
Figure 14C:
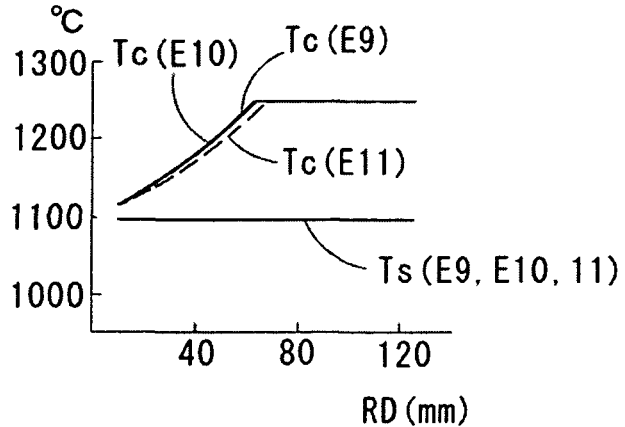

The results thereof are shown in Table 7. The supply amount of chlorosilanes per square millimeter of the surface of the rod, current value, surface temperature Ts of the rod and average center temperature Tc of the rod with respect to the silicon rod diameter are shown in FIGS. 14A to 14C. The supply amount of hydrogen is not shown figures, however the amount of hydrogen was adjusted so that the molar ratio of $H_2$/chlorosilanes is maintained substantially at 8.

TABLE 5

| Comparative example | Supply amount of chlorosilanes per square millimeter of the surface of the rod ×10⁻⁷ [mol/sec/mm²] | Pressure [MPa] | Surface temperature [° C.] | Adjustment of current & gas flow rate | Final rod diameter [mm] |
|---|---|---|---|---|---|
| C13 | 3.1 | 0.6 | 1100 | None | 85 |

TABLE 6

| Comparative example | Supply amount of chlorosilanes per square millimeter of the surface of the rod ×10⁻⁷ [mol/sec/mm²] | Pressure [MPa] | Surface temperature in first process [° C.] | Final rod diameter [mm] | Yield [mol %] | Si deposition amount per unit time and unit of chlorosilanes ×10⁻⁴ [g (Si)/g (chlorosilanes)/hr] |
|---|---|---|---|---|---|---|
| C14 | 3.1 | 0.6 | 1100 | 125 | 7 | 2.7 |

TABLE 7

| Examples | Temperature of inner surface of reactor [° C.] | Supply amount of chlorosilanes per square millimeter of the surface of the rod in first process ×10⁻⁷ [mol/sec/mm²] | Pressure [MPa] | Surface temperature [° C.] | Adjustment of current & gas flow rate | Final rod diameter [mm] | Yield [mol %] | Si deposition amount per unit time and unit of chlorosilanes ×10⁻⁴ [g (Si)/g (chlorosilanes)/hr] |
|---|---|---|---|---|---|---|---|---|
| E9  | 250 | 3.1 | 0.6 | 1100 | Adjusted | 125 | 11 | 3.5 |
| E10 | 300 | 3.1 | 0.6 | 1100 | Adjusted | 126 | 11 | 3.5 |
| E11 | 400 | 3.1 | 0.6 | 1100 | Adjusted | 126 | 10 | 3.5 |

As shown in Table 7, it was possible to increase the rod diameter to 100 mm or larger and it was possible to grow polycrystalline silicon with a higher yield than in the comparative examples C7 to C12.

In addition, by controlling the temperature of the wall of the reactor to 250° C., 300° C. and 400° C., the heat loss by the radiation and the convection from the rod was decreased and thus it was possible to prolong the first process. Accordingly, it was possible to grow polycrystalline silicon with a larger polycrystalline silicon deposition amount per unit time and unit of chlorosilanes than in the example E4 in which the temperature of the inner surface of the reactor is 200° C. under the same pressure and gas conditions.

When the average temperature of whole inner surface of the reactor is controlled as described above, it is desirable to maintain the temperature of the wall to be equal to or higher than 250° C. and equal to or lower than 400° C. in order to suppress the radiation and the convection from the rod. When the temperature is too high, impurities may be incorporated into the interior atmosphere from the constituent material of the wall, so the upper limit is preferably 400° C.

An example E12 was carried out by using the polycrystalline silicon apparatus shown in FIG. 8. In the apparatus shown in FIG. 8, the pre-heater 22 is provided to heat raw material gas by the heat exchange with discharge gas.

Examples E13 and E14 were tested by using the polycrystalline silicon producing apparatus shown in FIG. 7. In the apparatus shown in FIG. 7, the pre-heater 21 does not use the heat of discharge gas but has a heat source for heating a raw material gas.

In the examples E12 to E14, as in other examples, a reactor was supplied with raw material gas, in which chlorosilanes including trichlorosilane as a main component and 4.5 mol % of dichlorosilane were used and mixed with $H_2$, so as to have a molar ratio of $H_2$/chlorosilanes of 8. In the example E12, the temperature of raw material gas after passing through the pre-heater 22 by the heat exchange with the discharge gas shown in FIG. 8 was adjusted to 200° C., and in the examples E13 and E14, the temperature of raw material gas after passing through the pre-heater 21 shown in FIG. 7 was adjusted to 400° C. and 600° C., respectively. In both examples, a surface temperature of the rod was adjusted to 1100° C., a supply amount of chlorosilanes per square millimeter of the surface of the rod was adjusted to $3.1 \times 10^{-7}$ mol/sec/mm² and the pressure was adjusted to 0.6 MPa. After the average center temperature Tc of the rod reached 1250° C., the supply amount of gas of chlorosilanes and hydrogen, and the current value were adjusted so that the surface temperature Ts of the rod was maintained at 1100° C. and the average center temperature Tc was maintained at 1250° C. The temperature of an inner surface of the reactor was adjusted to 200° C.

Figure 15A:
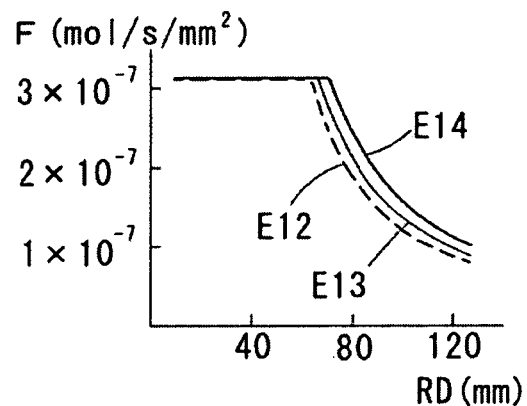
FIGS. 15A to 15C are graphs showing changes in the control state of a first process and a second process of the producing method of examples E12, E13 and E14 of the present invention.
Figure 15B:
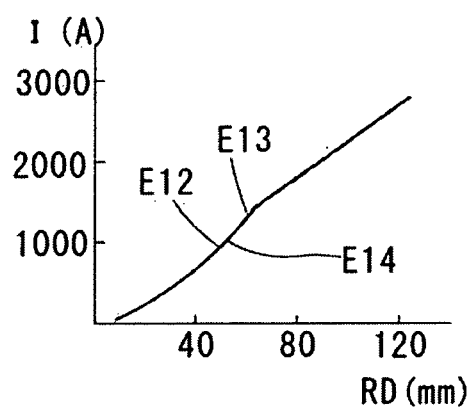
Figure 15C:
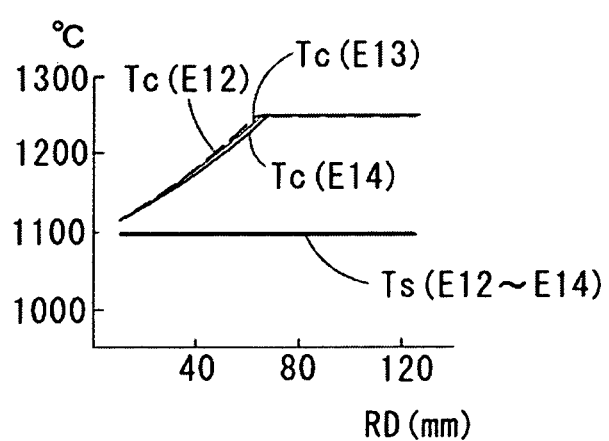

The results of the examples E12 to E14 are shown in Table 8. The supply amount of chlorosilanes per square millimeter of the surface of the rod, the current value, the surface temperature Ts of the rod and the average center temperature Tc of the rod with respect to the diameter of the polycrystalline silicon rod are shown in FIGS. 15A to 15C.

TABLE 8

| Example | Temperature of raw material gas [° C.] | Supply amount of chlorosilanes per square millimeter of the surface of the rod in first process ×10⁻⁷ [mol/sec/mm²] | Pressure [MPa] | Surface temperature [° C.] | Adjustment of current & gas flow rate | Final rod diameter [mm] | Yield [mol %] | Si deposition amount per unit time and unit of chlorosilanes ×10⁻⁴ [g (Si)/g (chlorosilanes)/hr] |
|---|---|---|---|---|---|---|---|---|
| E12 | 200 | 3.1 | 0.6 | 1100 | Adjusted | 125 | 11 | 3.5 |
| E13 | 400 | 3.1 | 0.6 | 1100 | Adjusted | 125 | 11 | 3.5 |
| E14 | 600 | 3.1 | 0.6 | 1100 | Adjusted | 125 | 10 | 3.6 |

As shown in Table 8, it was possible to increase the rod diameter to 100 mm or larger and it was possible to grow polycrystalline silicon with a higher yield than in the comparative examples.

By pre-heating the raw material gas supplied into the reactor, the heat loss from the rod to the gas was reduced and it was possible to prolong the first process. Accordingly, as compared with the case where the polycrystalline silicon deposition amount per unit time and unit of chlorosilanes was $3.4 \times 10^{-4}$ g (Si)/g (chlorosilanes)/hr under the same pressure and gas conditions in the example E4 in which the supply temperature of the raw material gas was 100° C., the polycrystalline silicon deposition amount per unit time and unit of chlorosilanes was improved to $3.5 \times 10^{-4}$ g (Si)/g (chlorosilanes)/hr in the example E12 in which the raw material gas was heated to 200° C. and in the example E13 in which the raw material gas was heated to 400° C., and improved to $3.6 \times 10^{-4}$ g (Si)/g (chlorosilanes)/hr in the example E14 in which the raw material gas was heated to 600° C. In this manner, it was possible to deposit faster. When the purity of the produced rods was examined, the rods of the examples E12 and E13 were suitable for silicon for semiconductors. However, the rod of the example E14 had lower purity than the examples E12 and E13 and the purity was not suitable for semiconductors.

In pre-heating the raw material gas as described above, when the raw material gas is pre-heated to be equal to or higher than 200° C. and equal to or lower than 600° C., the heat loss from the rod to the atmosphere gas can be effectively reduced.

The present invention is not limited to the above-described embodiments and various modifications may be made without departing from the scope of the present invention.

For example, in the above-described embodiments, the rod diameter is obtained from the analysis result of a gas chromatograph or the like. However, the rod diameter may be directly measured from the observation window. When the rods overlap and the rods installed at the center portion cannot be confirmed, the diameter of rods disposed at the outermost circumference may be used as a representative value.

The method disclosed in Japanese Unexamined Patent Application, First Publication No. 2001-146499 also may be applied.

In addition, when a batch process of the same condition is repeated, the steps of S1 to S10 are carried out in accordance with the flowcharts shown in FIGS. 3 and 4 to determine the adjustment pattern of the current and the amount of raw material gas supply as a recipe, and then the process can be performed by using this recipe. In this case, it is not necessary to measure a surface temperature of the rod after the determination of the recipe.

In the reactor, the electrodes holding the silicon seed rods are disposed in a substantially concentric pattern (concentric circles) as described above. However, it is desirable that the reactor employs a form in which no ejection nozzles for supplying raw material gas are disposed between an inner wall of the bell jar and the electrodes positioned along the outermost circumference of the reactor because the convection heat transfer from the rods positioned at the outermost circumference to the atmosphere gas is suppressed. Since the rods positioned at the outermost circumference are directly opposed to the inner wall of the reactor, the heat loss of the surface of the rod is high by the radiation from the surface of the rod to the inner wall of the reactor. For the temperature of the rods positioned at the outermost circumference is maintained at a predetermined range, it is necessary to increase the current value, therefore, the meltdown is easily caused. When a structure in which no ejection nozzles for supplying raw material gas are disposed on that side is employed, the convection heat transfer from the rods to the gas is suppressed so as to make meltdown unlikely.

The raw material gas includes hydrogen and chlorosilanes. In the raw material gas, the molar ratio of $H_2$/chlorosilanes is 8. However, the raw material gas is not limited thereto. For example, it is desirable for the molar ratio to be equal to or greater than 5 and equal to or less than 10 so as not to deposit polycrystalline silicon in the vapor phase and in order to rapidly grow the rod.

In the second process, like the examples, when the supply amount of chlorosilanes per square millimeter of the surface of the rod is controlled by controller, it is preferable that the molar ratio of $H_2$/chlorosilanes is maintained substantially at the predetermined value by controlled an amount of hydrogen per square millimeter of the surface of the rod. That is, when the supply amount of chlorosilanes per square millimeter of the surface of the rod is controlled by controller, the total amount of the raw material gas per square millimeter of the surface of the rod is controlled by controller. The molar ratio may be changed during the polycrystalline silicon producing process. Therefore, while maintaining the surface temperature and the average center temperature of the rod within predetermined ranges, the rod can be grown.

In the raw material gas, $SiH_4$, $Si_2H_6$ or the like may be included and the present invention also can be applied to a method of producing polycrystalline silicon by an ASiMi method, in which $SiH_4$ is used as a main component, other than the Siemens method.

What is claimed is:

1. A polycrystalline silicon producing method comprising:
   supplying electric current to a silicon seed rod in a reactor to make the silicon seed rod to generate heat;
   supplying raw material gas including chlorosilanes to the silicon seed rod; and
   depositing polycrystalline silicon on a surface of the silicon seed rod to be grown as a rod,
   wherein a pressure in the reactor is equal to or greater than 0.4 MPa and equal to or less than 0.9 MPa,
   the method includes a first process and a second process,
   in the first process, a surface temperature of the rod is maintained at a predetermined range by adjusting the current value in the silicon seed rod, and the raw material gas is supplied while maintaining a supply amount of chlorosilanes per square millimeter of the surface of the rod to be equal to or greater than $2.0 \times 10^{-7}$ mol/sec/mm$^2$ and equal to or less than $3.5 \times 10^{-7}$ mol/sec/mm$^2$ until a temperature of the center portion of a rod reaches a predetermined temperature lower than the melting point of the polycrystalline silicon, and
   in the second process, after the temperature of the center portion of the rod reaches a predetermined temperature lower than the melting point of the polycrystalline silicon, a previously determined current value is set corresponding to a rod diameter and the supply amount of the raw material gas per square millimeter of the surface of the rod is decreased to maintain the surface temperature and the temperature of the center portion of the rod to be within predetermined ranges, respectively.

2. The polycrystalline silicon producing method according to claim 1,
   wherein the temperature of the center portion of the rod in the second process is in the range equal to or higher than 1200° C. and equal to or lower than 1300° C.

3. The polycrystalline silicon producing method according to claim 1,
   wherein the temperature of the inner surface of the reactor is adjusted to be equal to or higher than 250° C. and equal to or lower than 400° C.

4. The polycrystalline silicon producing method according to claim 1,
   wherein the raw material gas is pre-heated to have a temperature equal to or higher than 200° C. and equal to or lower than 600° C. and then supplied to the reactor.

5. The polycrystalline silicon producing method according to claim 4,
   wherein the raw material gas is pre-heated to have a temperature equal to or higher than 200° C. and equal to or lower than 400° C. and then supplied to the reactor.

6. The polycrystalline silicon producing method according to claim 5,
   wherein discharge gas discharged from the reactor and the raw material gas are heat-exchanged to pre-heat the raw material gas.

7. The polycrystalline silicon producing method according to claim 1,
   wherein in the reactor, a raw material gas supply nozzle is not disposed between a rod positioned at the outermost circumference and the inner surface of the reactor.

8. The polycrystalline silicon producing method according to claim 1, wherein in the second process, the current value is increased in response to an increasing rod diameter in order to set the previously determined current value.

9. The polycrystalline silicon producing method according to claim 1, wherein in the second process, a surface temperature of the rod is constant in a range of 1000° C. to 1100° C.

* * * * *